United States Patent
Kuramochi et al.

[11] Patent Number: 6,143,990
[45] Date of Patent: Nov. 7, 2000

[54] PRINTED WIRING BOARD WITH TWO GROUND PLANES CONNECTED BY RESISTOR

[75] Inventors: Munehiro Kuramochi, Ebina; Shotaro Yoshimura, Numazu; Hiroshi Hagiwara, Ebina, all of Japan

[73] Assignee: Fuji Xerox Co., Ltd., Tokyo, Japan

[21] Appl. No.: 08/882,105

[22] Filed: Jun. 25, 1997

Related U.S. Application Data

[60] Provisional application No. 60/027,408, Sep. 30, 1996.

[30] Foreign Application Priority Data

Jun. 25, 1996 [JP] Japan .................................. 8-182692

[51] Int. Cl.⁷ .................................. H05K 1/16; H05R 9/09
[52] U.S. Cl. .......................... 174/260; 174/261; 174/262
[58] Field of Search ..................... 174/253, 255, 174/261, 262, 266, 36, 254, 35 R; 361/761, 762, 766, 792, 793, 794, 795, 749, 750, 751

[56] References Cited

U.S. PATENT DOCUMENTS

| | | | |
|---|---|---|---|
| 4,191,789 | 3/1980 | Brown et al. | 427/97 |
| 4,821,007 | 4/1989 | Fields et al. | 333/238 |
| 4,859,806 | 8/1989 | Smith | 174/261 |
| 5,185,502 | 2/1993 | Shepherd et al. | 174/262 |
| 5,294,751 | 3/1994 | Kamada | 174/52.4 |
| 5,436,405 | 7/1995 | Hogge, Jr. et al. | 174/35 R |
| 5,592,391 | 1/1997 | Muyshondt et al. | 364/489 |
| 5,670,824 | 9/1997 | Weinberg | 257/723 |
| 5,745,334 | 4/1998 | Hoffarth et al. | 361/313 |
| 5,912,597 | 9/1999 | Inagawa et al. | 333/1 |

FOREIGN PATENT DOCUMENTS

| | | |
|---|---|---|
| 5-226849 | 9/1993 | Japan . |
| 6-252563 | 9/1994 | Japan . |
| 6-334339 | 12/1994 | Japan . |
| 7-106766 | 4/1995 | Japan . |
| 7-54875 | 6/1995 | Japan . |
| 7-83185 | 9/1995 | Japan . |

*Primary Examiner*—Jeffrey Gaffin
*Assistant Examiner*—Kamand Cuneo
*Attorney, Agent, or Firm*—Oliff & Berridge, PLC

[57] ABSTRACT

A printed wiring board is provided with a ground wiring structure corresponding to a signal wiring structure. The ground wiring structure is furnished with a first wiring layer located on a first side surface of an insulating layer along with the signal wiring layer, and a second wiring layer located on another side surface of the insulating layer and sandwiching the insulating layer against the signal wiring layer. A resistor is interposed between the first wiring layer and the second wiring layer.

9 Claims, 6 Drawing Sheets

PRINTED WIRING BOARD WITH TWO GROUND PLANES CONNECTED BY RESISTOR

This applications claims priority of Provisional Application 60/027408, filed Sep. 30, 19996.

BACKGROUND OF THE INVENTION

1. Field of Invention

The present invention pertains to a printed wiring board used for a wiring component of a circuit configuration of an electronic apparatus. In particular, the invention relates to an improvement of a printed wiring board having an impedance matching the characteristic impedance of the transmission line.

2. Description of Related Art

Pursuant to an increase in speed of electronic circuits, the frequency of the transmitted signals has also increased, and matching of the characteristic impedance of the transmission line has become important.

Here, when the characteristic impedance of the transmission line is matched, it is effective in preventing erroneous recognition of signals and electromagnetic wave interference due to ringing, reflection, and the like. Also, even when analog signals are transmitted, it is effective in transmission of good-quality signals, having controlled the distortion, corruption, attenuation, and the like, of waveforms.

Past methods of matching the characteristic impedance of the transmission line are largely divided into those performed in stages for manufacturing printed wiring boards and those performed after having manufactured the printed wiring board. There are known various methods such as the following representative methods.

The first through third methods are performed when manufacturing printed wiring boards, and the fourth and fifth methods are performed after having manufactured the printed wiring boards.

The first method is a method that changes the width and thickness of the conductive pattern of the transmission line, and it matches the characteristic impedance of the transmission line by changing the thickness of the copper foil of the transmission line, for example, when connecting between hard printed wiring boards with a flexible printed wiring board (e.g., Japanese Laid-Open Patent No. 7-106766).

The second method adjusts the thickness of the insulating layer to meet the characteristics of the transmission line (e.g., Japanese Examined Patent No. 7-54875).

The third method adjusts the inductance of the insulating layer by selecting the material to meet the characteristics of the transmission line (e.g., Japanese Examined Patent No. 7-83185).

The fourth method provides a plurality of ground wiring layer patterns and through-holes corresponding respectively, so as to match the characteristic impedance of the transmission line after manufacturing a multilayer printed wiring board by selectively connecting the through-holes (e.g., Japanese Laid-Open Patent No. 6-252563).

The fifth method inserts a damping resistor and terminal resistor in the signal line, which generally can be said to be already well-known as a method of matching the characteristic impedance of the transmission line on a circuit.

However, in the first method (adjusting the width and thickness of the conductive pattern of the transmission line), because the width of the conductive pattern of the transmission line must be made smaller and the thickness must be made thinner, there occur technical problems when trying to increase the characteristic impedance of the transmission line. For example, the conductive pattern easily breaks, or it easily receives a direct influence of the precision of etching processing, and, due to deviation of the etching processing and structure, the fabricated transmission line simply tends to deviate from the intended characteristic impedance, or the conductive resistance ends up being increased, and the transmitted signals become attenuated needlessly.

Also, the second method (adjusting the thickness of the insulating layer), when trying to increase the characteristic impedance of the transmission line, because the thickness of the insulating layer must be made thicker, is difficult to apply to a flexible printed wiring board.

Furthermore, in the third method (adjusting the inductance of the insulating layer), material meeting the characteristics of the transmission line must be selected, and the cost simply soars, or it is difficult to accurately match the characteristic impedance of the transmission line only by inductance of the material.

Further still, since all of the first through third methods match the characteristic impedance during manufacturing of the printed wiring board, they do not permit adjustment of the characteristic impedance after manufacturing.

Also, in the fourth method (selectively connecting the ground wiring layers), there are technical problems because a plurality of ground wiring layers and a plurality of through-holes must first be established so that the through-holes can be selectively connected for adjusting the characteristic impedance. For example, space for the ground wiring layers and through-holes becomes unavailable for adjusting the characteristic impedance, and the printed wiring board simply becomes larger in scale by that amount, or the number of layers of the printed wiring board tends to increase, and it becomes difficult to apply to a flexible printed wiring board in that condition.

Furthermore, in the fifth method (inserting a damping resistor and a terminal resistor), for the generally well-known method of inserting a damping resistor, since the time constant of the circuit consequent to the damping resistor becomes greater, there are technical problems. For example, the potential of the arriving signals is decreased, and decrease of transmission speed is caused by corruption of the waveforms. On the other hand, in the method of inserting a terminal resistor, since the power consumption is increased by the amount of terminal resistors inserted, the drive power must be increased, and the power capacity is increased by that amount, thus a condition is caused that does not meet the demand for reduction of power cost.

SUMMARY OF THE INVENTION

The invention was created in order to solve the above technical problems, and it provides a printed wiring board capable of easily and correctly matching the characteristic impedance of the transmission line, while avoiding the various harmful effects of the prior methods.

That is, as shown in FIG. 1, one embodiment of the invention is a printed wiring board provided with a ground wiring structure 2 corresponding to a signal wiring layer 1, wherein the ground wiring structure 2 is furnished with a first ground wiring layer 2a provided in the vicinity of the signal wiring layer 1, and a second ground wiring layer 2b provided sandwiching an insulating layer 3 against the signal wiring layer 1, and a resistor 4 is interposed between the first ground wiring layer 2a and the second ground wiring layer 2b.

In other words, the present invention is furnished with a first ground wiring layer 2a provided in the vicinity of the signal wiring layer 1 and a second ground wiring layer 2b connected to the first ground wiring layer by way of a resistor 4, together serving as the ground wiring structure 2.

The object of the invention includes the entirety of multilayer printed wiring boards, and while it applies to hard printed wiring boards, it is particularly preferred from the point that it can be applied easily to a flexible printed wiring board as well. Also, there is no obstacle to discretionary selection of a method of fabricating the printed wiring board, as long as the signal wiring layer 1 and ground wiring structure 2 are formed using well-known etching processing, and the like, using a substrate having metallic foil applied on one surface or a substrate having metallic foil applied on both surfaces.

Also, the signal wiring layer 1 forms a signal wiring pattern with a conductive body, and the ground wiring structure 2 forms a wiring pattern with a conductive body and is connected to a base potential. Thus, it is grounded, and if, for example, a power source layer outside the ground is used as the base potential, this power source layer may also be used as the ground wiring structure.

Furthermore, the matching of the characteristic impedance of a printed wiring board of the present application is performed by using a micro-strip structure or strip structure.

In this case, both the wiring pattern of the signal wiring layer 1 and the wiring pattern of the second ground wiring layer 2b form micro-strip lines.

Also, as for the resistor 4, as long as it is endowed with a specified value of resistance, there is no obstacle to discretionary selection such as using a resistance component and printing with conductive paste.

As the aforementioned resistance component, there are the well-known lead-connected resistance components made of carbon skin film and metal oxide, and there are chip-style resistance components.

Here, by using a pre-existing resistance component, it becomes possible to obtain the desired value of resistance easily, and since the impedance is controlled by selecting the value of resistance, the desired characteristic impedance can be obtained easily.

In particular, implementation using chip-style resistance components is preferred from the standpoint that interlevel connection and insertion of the resistor can be performed at one time, and that they are small in size.

Also, when printing of conductive paste is used as the resistor 4, it becomes cheaper compared with methods implementing a resistance component. Moreover, since the layers are connected by filling the conductive paste into the through holes of the insulating layer 3, it is preferred from the point of conserving space.

However, when using conductive paste, the part must be made so as not to be accidentally contacted with a conductor such as a frame by covering the conductive paste with an overlay covering.

Also, both the first ground wiring layer 2a and the second ground wiring layer 2b are formed on different surfaces sandwiching an ordinary insulating layer 3. The aforementioned resistor 4 serves as a means for interlevel interconnection of the insulating layer 3, and it is preferred from the point that a separate means for interlevel connection becomes unnecessary.

When the first ground wiring layer 2a is formed reaching the opposite side surface of the insulating layer 3 through a lead-through part (through-hole plating, etc.) provided on the insulating layer 3, since both the first ground wiring layer 2a and the second ground wiring layer 2b are now on the same surface, a resistor 4 can be interposed therebetween on the same surface.

Next, the operation of the above-mentioned technical means is explained.

In the printed wiring board shown in FIG. 1, because a resistor 4 is interposed between the first ground wiring layer 2a and the second ground wiring layer 2b, the characteristic impedance of the transmission line is controlled by selecting the value of resistance of the resistor 4.

As explained above, according to the invention, by interposing a resistor between the first ground wiring layer and the second ground wiring layer, and by selecting the value of resistance of the resistor, the characteristic impedance of a transmission line is controlled. Therefore, from this fact, the characteristic impedance can be selected easily and correctly even after manufacturing of the printed wiring board, and matching of the characteristic impedance of the transmission line can be performed assuredly.

Therefore, signal transmission having good waveform quality can be realized assuredly by reducing the distortion of waveforms, noise, and erroneous recognition of signals due to mismatching of the impedance of digital signals and analog signals.

Also, even in micro-strip structures and strip structures, it becomes possible to obtain a high characteristic impedance easily without decreasing the width of the conductive pattern of the signal wiring layer, and without increasing the thickness of the insulating layer.

Therefore, harmful effects due to making the signal wiring layer too thin (deviation of the characteristic impedance due to manufacturing errors due to cutting, etching, and the like, of the signal wiring layer) can be eliminated, the insulating layer can be made thinner to a necessary minimum, and it can be applied easily to flexible printed wiring boards.

Furthermore, because there is no need to insert a damping resistor and a terminal resistor in the signal wiring layer, the various harmful effects, such as decrease of signal potential, decrease of transmission speed, and increase of power capacity, can be prevented.

Also, in the invention, if the resistor is made to serve as an interlevel connection of the first and second ground wiring layers, a means for performing interlevel connection separately becomes unnecessary, and the configuration of the printed wiring board can be simplified.

DETAILED DESCRIPTION OF PREFERRED EMBODIMENTS

Below, the invention is explained in detail based on embodiments shown in the attached drawings.

Figure 1:
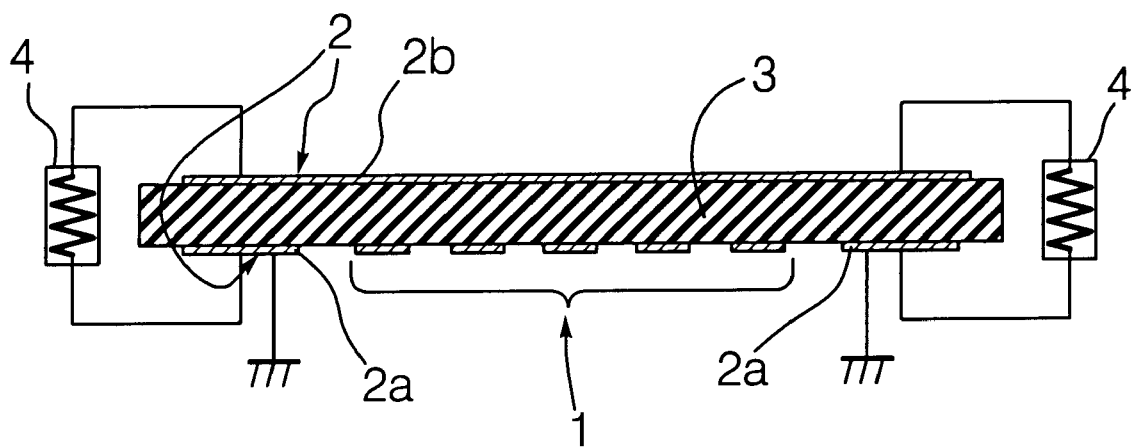
FIG. 1 is an explanatory drawing showing a schematic of a printed wiring board pertaining to the invention.
Figure 2:
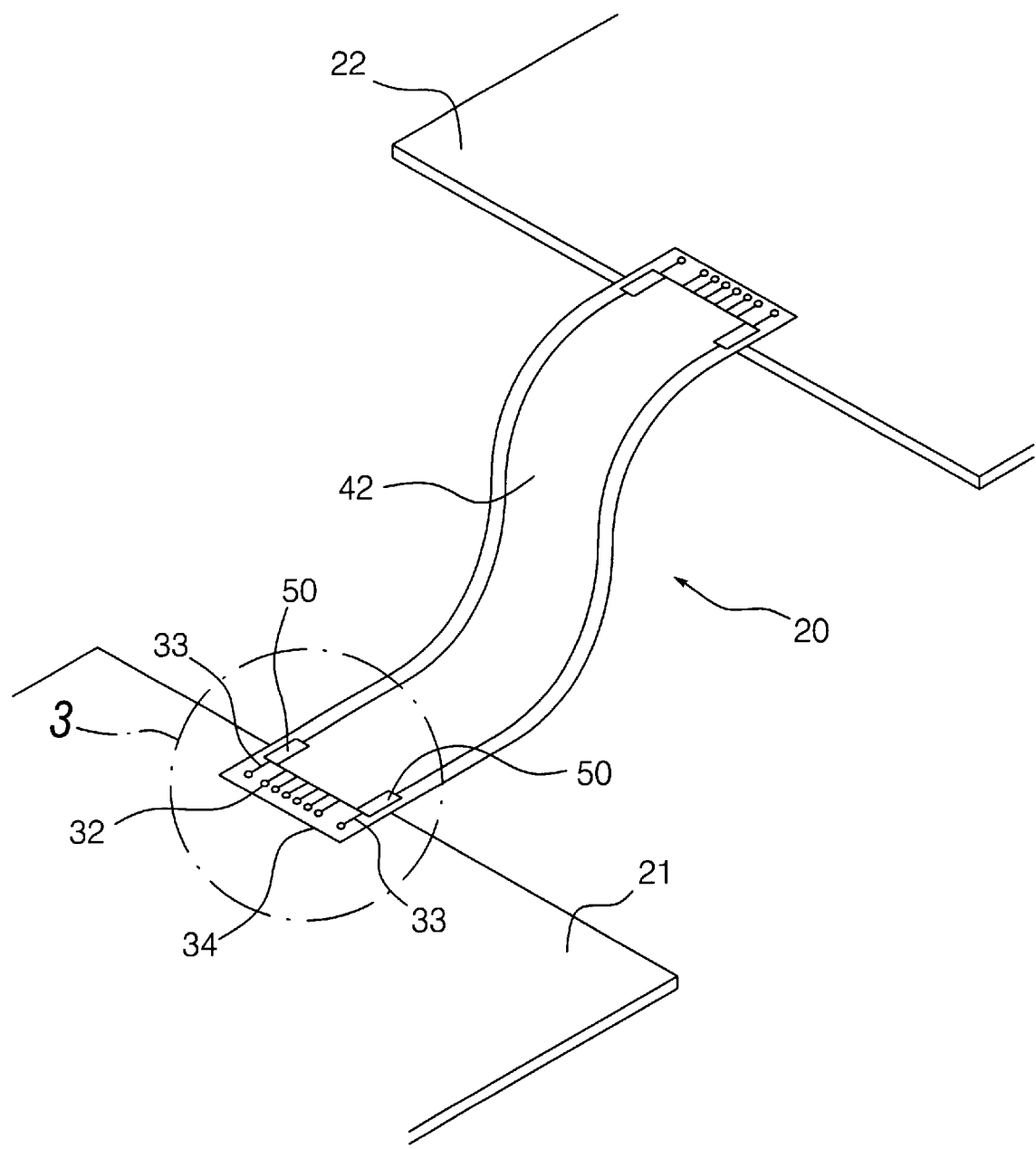
FIG. 2 is an explanatory drawing showing one example of use of a printed wiring board pertaining to the first embodiment.

FIG. 2 shows an example of a printed wiring board to which the first embodiment of the present invention is applied as shown in FIG. 1 and explained on pages 4–5.

In same figure, printed wiring board 20, to which the present invention is applied, possesses flexibility and is used as a long wiring component for connecting hard printed wiring boards 21 and 22.

Figure 3:
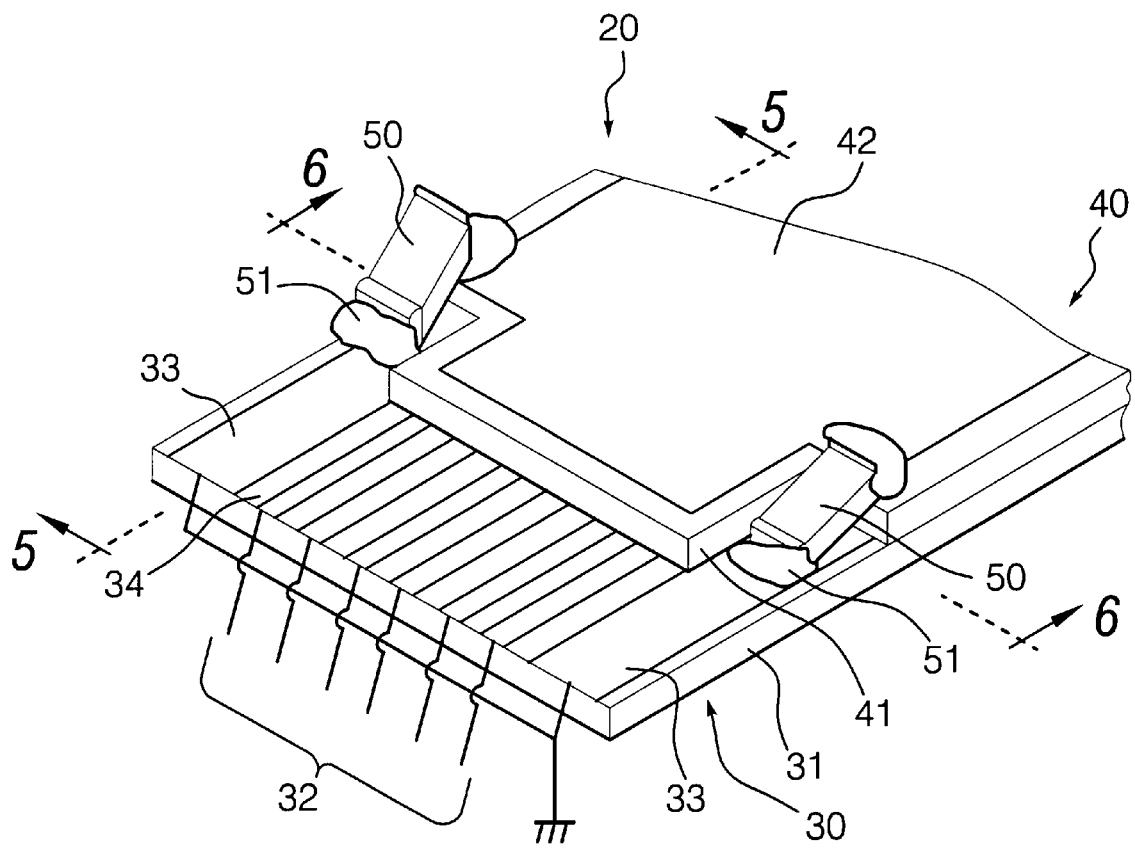
FIG. 3 is a detailed drawing of the part III in FIG. 2 of a printed wiring board pertaining to the first embodiment.
Figure 4:
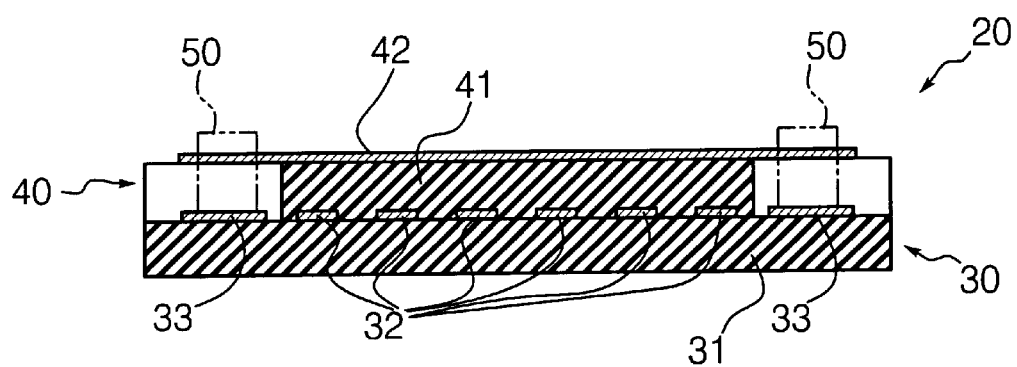
FIG. 4 is a section at line VI—VI in FIG. 3.
Figure 5:
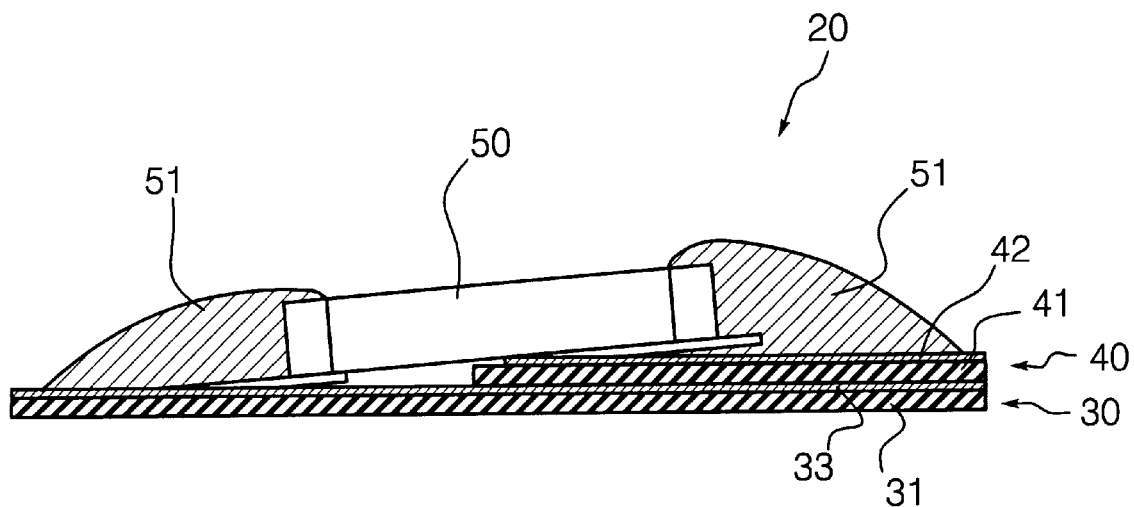
FIG. 5 is a section at line V—V in FIG. 3.

In the present embodiment, as shown in FIGS. 3 to 5, printed wiring board 20 has a two-layer structure with substrates 30 and 40 having flexibility and being layered. The one-sided printed substrate 30, positioned on the lower side, has a signal wiring layer 32 formed on one side (top surface) of an insulating base 31 having a constant thickness, and has a first ground wiring layer 33 formed outside (in the lateral direction) of the signal wiring layer 32. Meanwhile, the one-sided printed substrate 40, positioned on the upper side, has a second ground wiring layer 42 solid-formed on almost the entire area of one side (top surface) of an insulating base 41 having a constant thickness.

In the present embodiment, both the wiring pattern of the signal wiring layer 32 and the wiring pattern of the second ground wiring layer 42 form micro-strip lines.

In the present embodiment, as a fabrication method for the printed wiring board 20, a method is adopted, for example, that forms one-sided printed substrates 30 and 40 by forming wiring patterns corresponding to the signal wiring layer 32, the first ground wiring layer 33, and the second ground wiring layer 42 by a well-known method such as etching in relation to one-sided foil plated boards having metal foil (e.g., copper foil) layered on one side of insulating bases 31 and 41, and layers these integrally while determining the relative positions of the substrates 30 and 40 (e.g., Japanese Laid-Open Patent No. 6-334339).

Furthermore, the two ends in the longitudinal direction of the printed wiring board 20 pertaining to the invention form shapes in which the end of the lower layer protrudes beyond the end of the upper layer, and is configured as a terminal part 34 by which the ends of the signal wiring layer 32 and the first ground wiring layer 33 of the lower substrate 30 on both ends are connected to the hard printed wiring boards 21 and 22, respectively.

Also, between the first ground wiring layer 33 of the terminal part 34 of the lower substrate 30 and the end of the second ground wiring layer 42 of the upper substrate 40, chip-style resistance components 50 are respectively implemented and connected, straddling diagonally across the first and second ground wiring layers 33 and 42.

In the present embodiment, the values of resistance of all chip-style resistance components 50 are selected to have an identical value. Solder 51 is used for installing chip-style resistance components 50.

Figure 6:
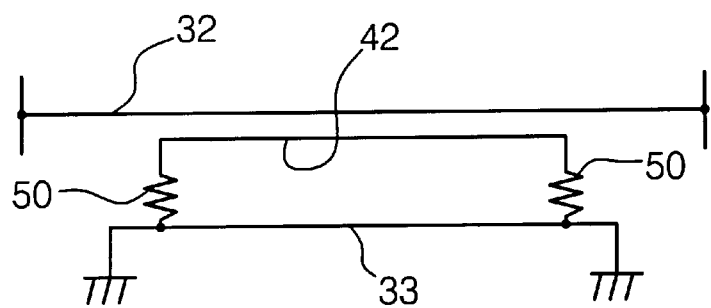
FIG. 6 is a sample drawing showing a circuit configuration of a printed wiring board pertaining to the first embodiment.

Furthermore, the transmission circuit (transmission line) of the present embodiment is shown as an example in FIG. 6.

In the same figure, the second ground wiring layer 42 is connected in relation to the first ground wiring layer 33 by way of chip-type resistance components 50 and the first ground wiring layer 33 is grounded.

Consequently, the first ground wiring layer 33 works as an ordinary ground line because it does not go through a resistor, while being positioned in the vicinity of the signal wiring layer 32.

Next, the characteristic impedance of the transmission line of the printed wiring board pertaining to the present embodiment is measured.

Measurement of the characteristic impedance in the present embodiment was performed by TDR (Time Domain Reflectometry) utilizing the response of pulse signals using, for example, a Hewlett-Packard HP54120.

Figure 7:
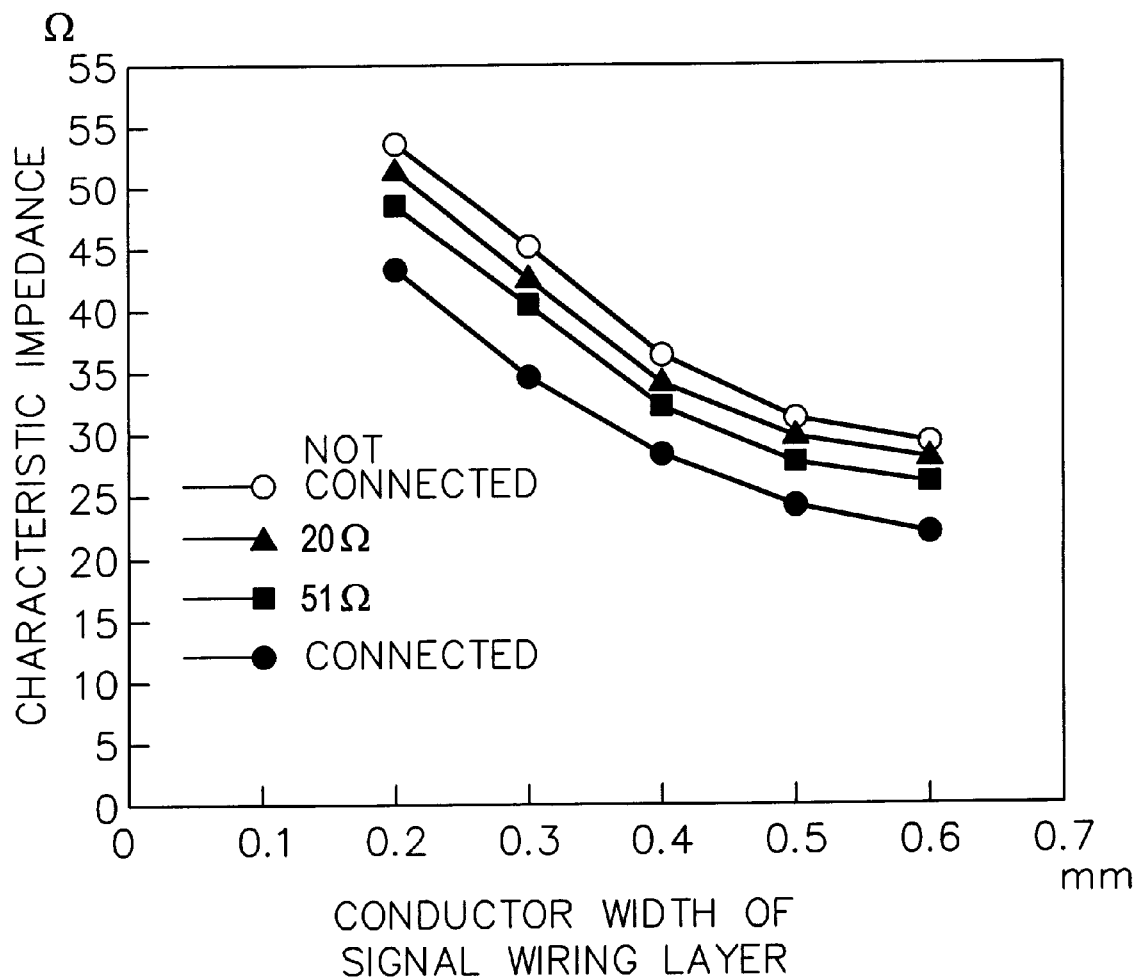
FIG. 7 is a graph showing the change of characteristic impedance for each conductor width of the signal wiring layer when selecting the values of the resistance of the chip-style resistance components in the first embodiment.

At this time, the value of resistance of the chipstyle resistors 50 (in the present embodiment, 20Ω and 51Ω) was changed, and the results of measurement of characteristic impedance are shown in FIG. 7. In the same figure, "connected" signifies a shorted (resistance zero) state between the two, and "not connected" signifies an insulated state between the two.

Also, in FIG. 7, when measuring characteristic impedance, the conductor width of the signal wiring layer was changed suitably, and the relationship between the two is also described.

According to FIG. 7, it is understood that characteristic impedance is adjusted minutely by suitably selecting the value of resistance of chip-style resistance components 50.

In the present embodiment, two chip-style resistance components 50 are provided respectively on both ends of the printed wiring board 20, and the respective values of resistance are selected to be the same. However, one chipstyle resistance component 50 may be provided respectively on both ends of the printed wiring board 20. Also, even when two chip-style resistance components 50 are provided respectively on both ends of the printed wiring board 20, the values of resistance of the two chip-style resistance components 50 may be selected to respectively different values according to the configuration of the signal wiring layer 32 and the ground wiring layers 33 and 42.

Figure 8:
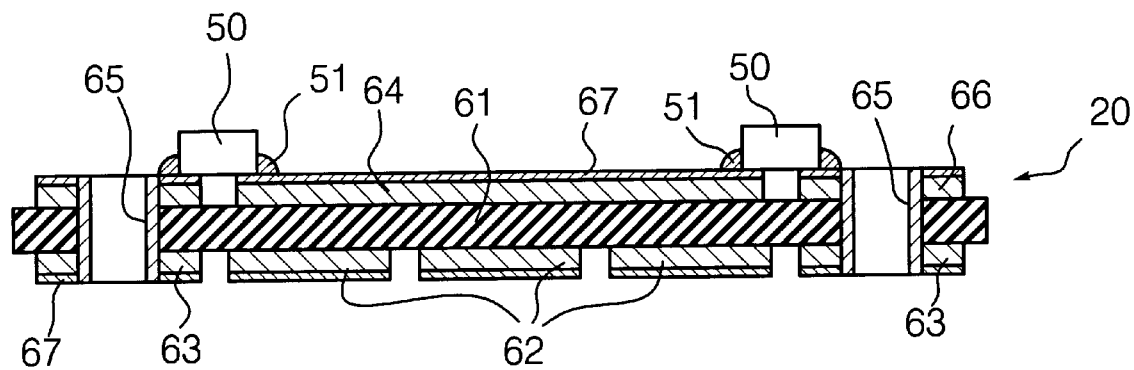
FIG. 8 is an explanatory drawing of the same section as FIG. 4, showing a printed wiring board pertaining to the second embodiment.

FIG. 8 shows a second embodiment of the printed wiring board to which the present invention is applied.

In the same figure, printed wiring board 20 was fabricated as a two-surface printed wiring board having a signal wiring layer 62 and first and second ground wiring layers 63 and 64 layered by forming patterns using wellknown through-hole plating and subtractive methods using a board having metal foil attached to both surfaces of an insulating base 61.

In the present embodiment, on one side (lower surface) of insulating base 61, there is formed a first ground wiring layer 63 in addition to there being formed a signal wiring layer 62. On the part opposing the signal wiring layer 62, on the other side (top surface) of insulating base 61, there is layered a second ground wiring layer 64 in solid form, and on both sides of that (in the lateral direction), there are conductive layers 66 (corresponding to first ground wiring layer 63) connected to the aforementioned first ground wiring layer 63 by way of through-hole plating 65.

Also, a chip-style resistance component 50 is implemented and connected to a pattern 51, straddling the second ground wiring layer 64 and the conductive layer 66, and a chip-style resistance component 50 is thereby interposed between the grounded first ground wiring layer 63 and second ground wiring layer 64. In the same figure, symbol 67 indicates a plating layer.

Consequently, in the present embodiment, the characteristic impedance can be controlled by suitably selecting the values of resistance of the chip-style resistance components in the same manner as the first embodiment.

Figure 9:
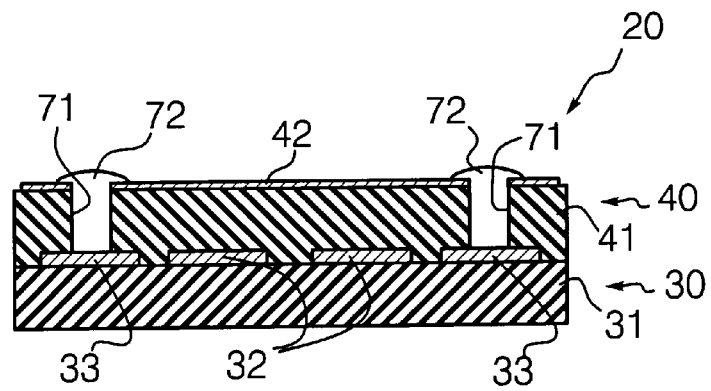
FIG. 9 is an explanatory drawing of the same section as FIG. 4, showing a printed wiring board pertaining to the third embodiment.

FIG. 9 shows a third embodiment of the printed wiring board to which the invention is applied.

In FIG. 9, printed wiring board 20 becomes a two-layer structure (one-sided two-layer FPC) having one-sided printed substrates 30 and 40, possessing flexibility, layered in roughly the same manner as the first embodiment. A signal wiring layer 32 and first ground wiring layer 33 are formed on the one-sided printed substrate 30 on the lower layer, a second ground wiring layer 42 is formed on the one-sided printed substrate 40 on the upper layer, and the ends of the lower layer in the longitudinal direction of the one-sided printed substrates 30 and 40 are made as terminal parts 34 (refer to FIG. 3) by making them project beyond the ends of the upper layer.

In the present embodiment, the structure of the connections of the first and second ground wiring layers 33 and 42 differ from that of the first embodiment. Through holes 71 are formed for connecting the first and second ground wiring layers 33 and 42, and carbon paste (TU-30SKC from Asahi Kagaku Kenkyujo (Asahi Scientific Labs)) is used here as the conductive paste 72.

At this time, by making the filled conductive substance carbon paste, the resistance of connection of the through holes 71 rises, and a state identical to that of having interposed a resistor between the two layers is achieved.

That is, it was confirmed that it becomes possible to control the characteristic impedance by suitably selecting the value of resistance of the conductive paste 72.

In the present embodiment, an external overlay covering, not illustrated, covers the surface of the printed wiring board to avoid situations in which the conductive paste 72 makes external contact.

Various modifications, improvements and other embodiments will become apparent to those skilled in the art once given this disclosure. These modifications, improvements and other embodiments are considered to be within the scope of this invention as defined by the following claims.

What is claimed is:

1. A printed wiring board, comprising:
   a ground wiring structure having a first wiring layer and a second wiring layer;
   a signal wiring layer;
   at least one resistor means for controlling a characteristic impedance between the signal wiring layer and the first wiring layer;
   and an insulating layer,
   wherein the first wiring layer is coupled to ground and located on a first side surface of the insulating layer along with the signal wiring layer, the insulating layer is sandwiched between the second wiring layer and the signal wiring layer, said second wiring layer is located on the second side surface of the insulating layer, and the at least one resistor means is interposed between the first wiring layer and the second wiring layer.

2. A printed wiring board as defined in claim 1, wherein the at least one resistor means performs interlevel connection of the first and second wiring layers.

3. A printed wiring board as defined in claim 1, wherein the first wiring layer electrically contacts the second side surface of the insulating layer through a lead-through provided in the insulating layer, and the at least one resistor means is located with the second wiring layer on the second side surface.

4. A printed wiring board as defined in claim 1, wherein the at least one resistor means includes a resistance component.

5. A printed wiring board as defined in claim 1, wherein the at least one resistor means is printed with conductive paste.

6. A printed wiring board as defined in claim 1, wherein a wiring pattern of the signal wiring layer and a wiring pattern of the second wiring layer form micro-strip lines.

7. A printed wiring board as defined in claim 1, wherein the printed wiring board is flexible.

8. A printed wiring board, comprising:
   a ground wiring structure having a first wiring layer and a second wiring layer;
   a signal wiring layer; and
   at least one resistor means for controlling a characteristic impedance between the signal wiring layer and the first wiring layer, wherein the first wiring layer is coupled to ground and located on a first side surface of an insulating layer along with the signal wiring layer, and the second wiring layer is located on a second side surface of the insulating layer and is connected through the at least one resistor to the first wiring layer.

9. A printed wiring board that connects a first device and a second device, the printed wiring board comprising:
   an insulating layer,
   a conductive signal wiring layer electrically connecting the first device and the second device and located on one side surface of the insulating layer,
   a conductive first wiring layer connected to a ground and located on the one side surface of the insulating layer along with the signal wiring layer,
   a conductive second wiring layer connected to ground provided on another side surface of the insulating layer, and
   at least one resistor means for controlling a characteristic impedance between the signal wiring layer and the first wiring layer electrically connecting the first and second wiring layers.

* * * * *